(12) United States Patent
Huang

(10) Patent No.: US 7,369,441 B2
(45) Date of Patent: May 6, 2008

(54) SENSING CIRCUIT FOR MULTI-LEVEL FLASH MEMORY

(75) Inventor: Chung-Meng Huang, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 65 days.

(21) Appl. No.: 11/362,067

(22) Filed: Feb. 27, 2006

(65) Prior Publication Data
US 2007/0025146 A1 Feb. 1, 2007

(30) Foreign Application Priority Data
Jul. 29, 2005 (TW) .............................. 94125874 A

(51) Int. Cl.
*G11C 11/34* (2006.01)
*G11C 16/06* (2006.01)
(52) U.S. Cl. .................... 365/185.21; 365/185.03; 365/185.2; 365/189.09
(58) Field of Classification Search .......... 365/185.21, 365/185.03, 185.2, 185.33, 189.07, 189.09
See application file for complete search history.

(56) References Cited

U.S. PATENT DOCUMENTS

| 5,943,272 A * | 8/1999 | Chang ................ 365/189.09 |
| 6,094,374 A * | 7/2000 | Sudo ................. 365/185.22 |
| 6,097,635 A * | 8/2000 | Chang ................ 365/185.21 |
| 6,404,679 B1 * | 6/2002 | Guedj ................ 365/185.21 |

* cited by examiner

*Primary Examiner*—Anh Phung
*Assistant Examiner*—Toan Le
(74) *Attorney, Agent, or Firm*—Birch, Stewart, Kolasch & Birch, LLP

(57) ABSTRACT

A sensing circuit for multi-level flash memory is disclosed. The advantages of the sensing circuit are reducing the circuit size, reducing the testing time for tuning reference voltage and maintaining a constant difference between two approximate reference voltages. The sensing circuit comprises a reference voltage generator which includes a number of serial connected resistive devices and provides several reference voltages by voltage division; a data saving circuit outputs a data voltage; a comparing circuit compares the data voltage with the several reference voltages to output a comparing signal; a decoder receives and then decodes the comparing signal to output the data.

14 Claims, 2 Drawing Sheets

SENSING CIRCUIT FOR MULTI-LEVEL FLASH MEMORY

BACKGROUND OF THE INVENTION

1. Field of the Invention

The present invention generally relates to a sensing circuit for multi-level flash memory, and more particularly to a sensing circuit for multi-level flash memory by using voltage division to provide reference voltages.

2. Description of the Prior Art

In conventional memory devices, data is stored in a flash memory cell in the form of electrical charge accumulated inside an inner gate, which is known as a floating gate. The amount of charge stored in the floating gate depends on the voltage applied to the external gate of the memory cell that controls the magnitude of electrical current flowing through it. The data state "0", or "1"represented by the memory cell depends on whether threshold voltage generated by the stored charge exceeds a specified threshold voltage or not. However, such conventional memory has the limitation that one memory cell can distinguish only two different states, i.e., one memory cell can store only one-bit of data. As a result, limited storage capacity becomes a disadvantage of conventional memory device.

FIG. 1 illustrates an improved multi-level flash memory sensing circuit according to known arts. In the circuit, a flash memory cell capable of storing two bits of data was shown. A flash memory constructed from such kind of cells can thus provide double storage capacity within the same dimension. FIG. 1 contains a reference voltage generator, a data saving circuit, a comparing circuit and a decoder 145. The reference voltage generator, which includes resistive devices 100, 103, 106, bit line clamp circuits 112, 115, 118, and the reference memory cells 124, 127, 130, is to provide different reference voltage levels REF1, REF2, and REF3.

The data saving circuit, which includes a resistive device 109, a bit line clamp circuit 121, and a flash memory cell 133, is for storing digital information. The comparing circuit, which includes comparators 136, 139, and 142, is intended to compare the voltage level stored in the data saving circuit with the voltage level generated by the reference voltage generator. The comparing circuit sends digital signals representing the comparing result to the decoder 145, and the decoder 145 decodes information stored in the flash memory cell 133 according to the permutation of the digital signals.

A key factor that the circuit shown in FIG. 1 can store two bits of digital data is that it contains a reference voltage generator which is designed to output several different reference voltage levels. In the example of FIG. 1, three different reference voltage levels will be generated to distinguish four distinct voltage ranges. By the comparing circuit, it can determine to which range the voltage level is stored in the data saving circuit, then it is able to decode the information stored in the data saving circuit.

FIG. 2 shows aforementioned three reference voltage levels REF1, REF2, REF3 as well as four voltage ranges defined thereby. Specifically, we have a first range with a voltage level less than REF1, a second range with a voltage level between REF1 and REF2, a third range with a voltage level between REF2 and REF3, and a fourth range with a voltage level greater than REF3. Vh1 represents the voltage level kept in the data saving circuit. The flash memory cell is said to keep information "A" when Vh1 is in the first range. Likewise, the flash memory cell is said to respectively keep information "B", "C", or "D" when Vh1 is in the second, third, or fourth range. States "A" through "D" can be represented by two bits of digital code in this case. "00", for example, can be assigned to state "A", "01" can be assigned to "B", "10" can be assigned to "C", and "11" can be assigned to "D". Alternatively, "11,10,01,00" or any other different permutation can be assigned to states "A,B,C,D" respectively.

As the reference voltage generator provides more different voltage levels, and thus more voltage ranges, more information represented by the flash memory cell of the data saving circuit, will be able to be discriminated. A disadvantage of the circuit shown in FIG. 1 is, however, that the same number of reference voltage generating units must be provided to generate the required number of reference voltage levels. Each reference voltage generating unit includes one resistive device, one bit line clamp circuit, and one reference memory cell. On the other hand, before each reference voltage generating unit is qualified to work, they must be calibrated for the correct voltage level output, and the calibration process needs some duration of testing time. Moreover, except the range under the smallest reference voltage level and the range above the largest reference voltage level (such as the first and the fourth ranges in FIG. 2), all the other ranges (such as the second and the third ranges in FIG. 2) must meet a requirement that their extent should be constant, i.e., the difference between any two adjacent reference voltage levels has to be fixed.

In view of the impact of the number of reference voltages on both the data storage capacity and the testing duration for reference voltage calibration process, and the requirement of constant reference voltage ranges, there is a need to provide an improved reference voltage generator for the sensing circuit for multi-level flash memory to resolve above problems.

SUMMARY OF THE INVENTION

In view of the foregoing, it is an object of the present invention to provide a sensing circuit for multi-level flash memory with an improved reference voltage generating circuit, so that, comparing with prior arts, the same number of reference voltage levels can be provided in a smaller dimension of circuit.

It is another object of the present invention to provide a multi-level flash memory sensing circuit which takes less testing time for the reference voltage calibration process, so that time efficiency during mass production can be increased.

According to some of the embodiments, a further object of the present invention is to provide a multi-level flash memory sensing circuit which has a constant difference between any two adjacent reference voltage levels.

According to above objects, the present invention provides a multi-level flash memory sensing circuit including a reference voltage generator, which has a number of resistive devices connected in serial mode and provides several reference voltages by voltage division; a data saving circuit to output a data voltage; a comparing circuit comparing the data voltage with reference voltages to output comparing signals; and a decoder receiving and decoding the comparing signals to output the data representing the information stored. As a result, the global circuit dimension will be reduced, the testing time for reference voltage calibration will be decreased, and the difference between adjacent reference voltages will be kept constant.

DETAILED DESCRIPTION OF THE INVENTION

The detailed description of the present invention will be discussed in the following embodiment, which is not intended to limit the scope of the present invention, but can be adapted for other applications.

Figure 1:
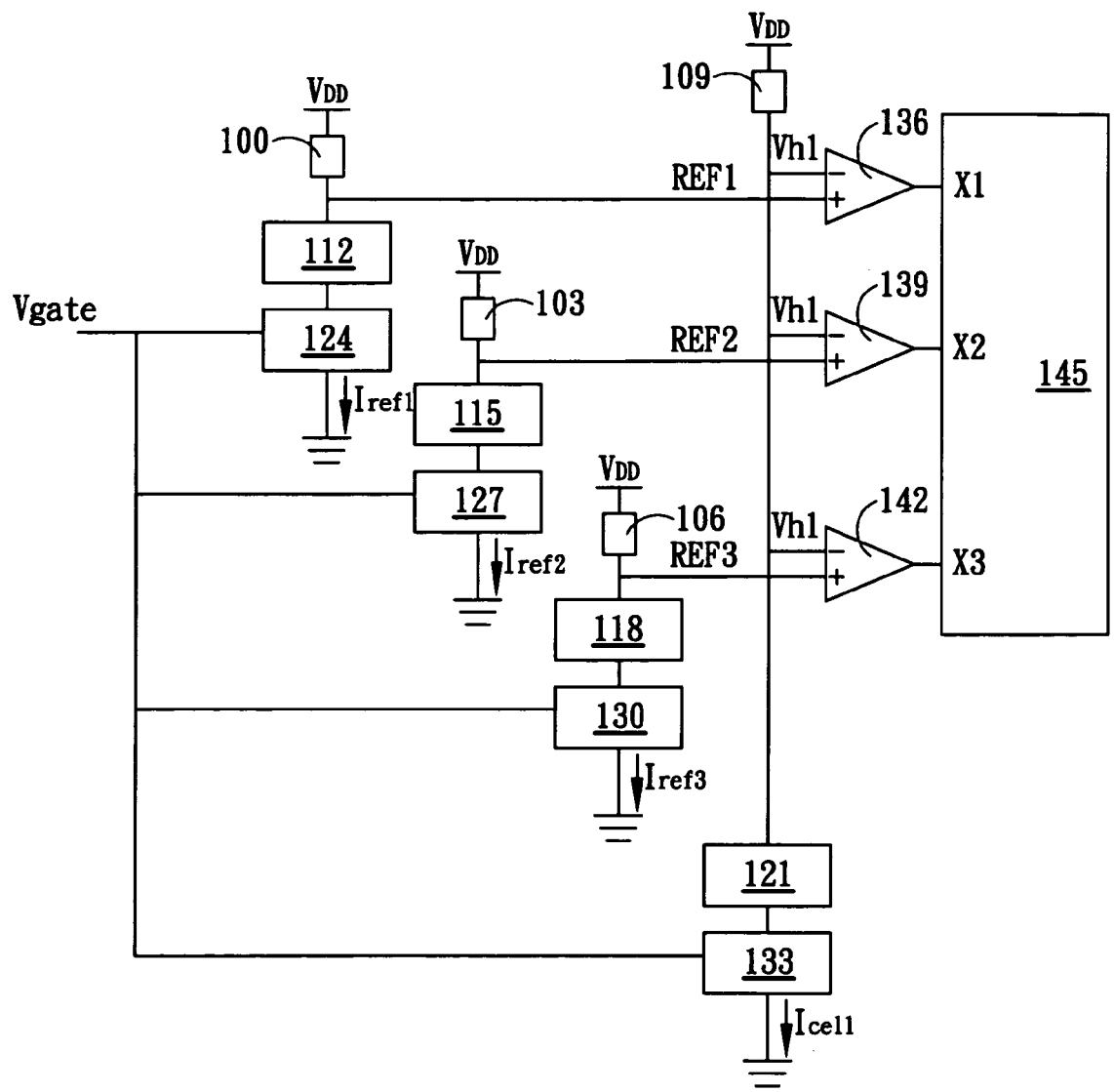
FIG. 1 shows a sensing circuit for multi-level flash memory according a prior art.
Figure 2:
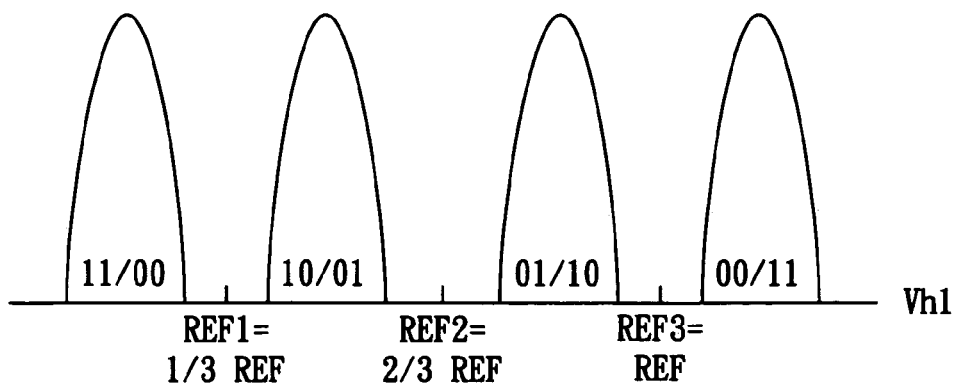
FIG. 2 shows a diagram about possible assignment of 2-bit digital codes with respect to the data voltage levels of a sensing circuit for multi-level flash memory.
Figure 3:
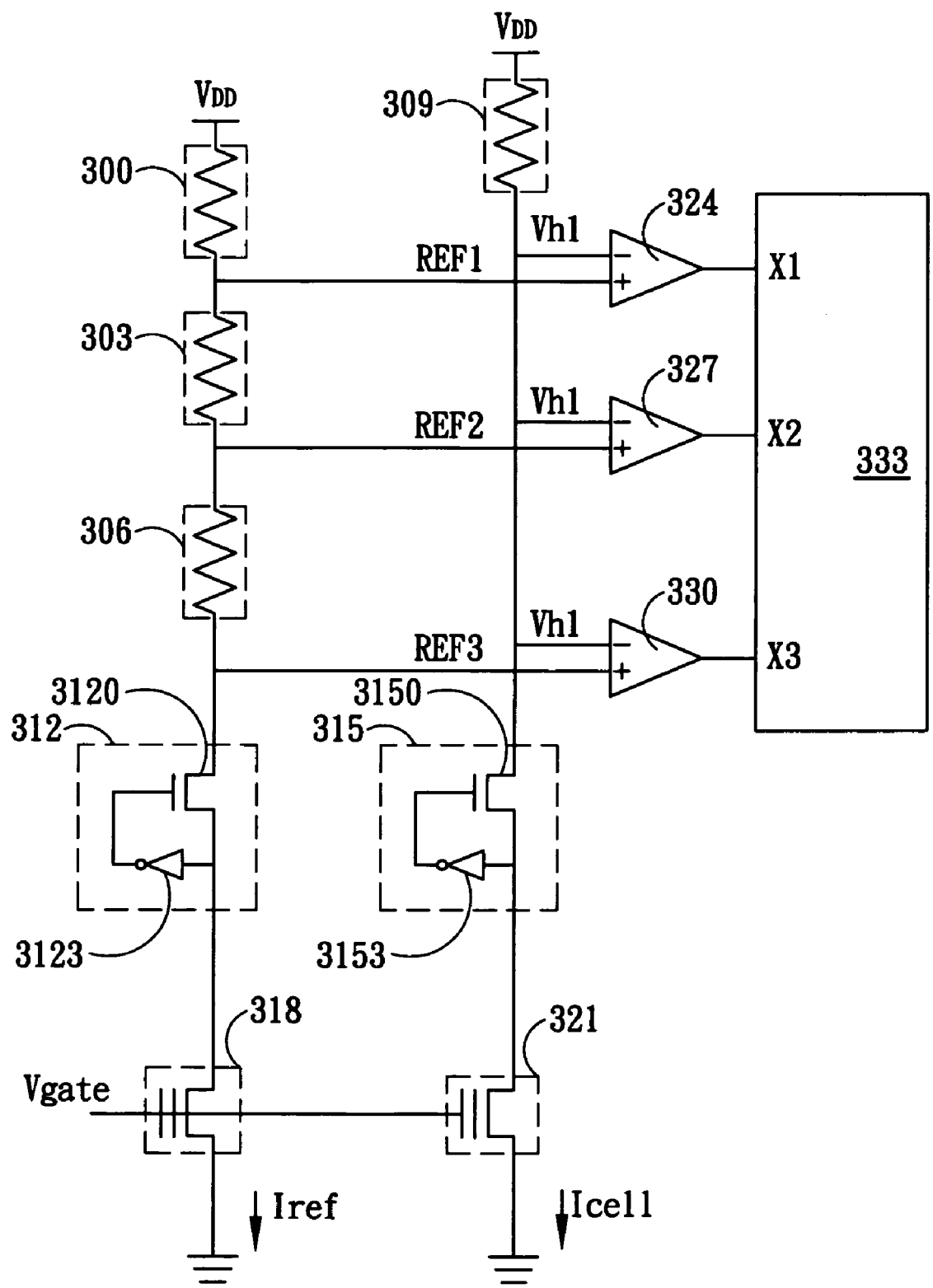
FIG. 3 shows a sensing circuit for multi-level flash memory according to the present invention.

The present invention discloses a sensing circuit for multi-level flash memory capable of reducing global circuit dimension as well as decreasing the reference voltage calibration time. FIG. 3 shows the circuit diagram of one embodiment according to present invention. The diagram includes a reference voltage generator, a data saving circuit, a comparing circuit, and a decoder 333. The reference voltage generator contains a first resistive device 300, a second resistive device 303, a third resistive device 306, a first bit line clamp circuit 312, and a reference memory cell 318. Terminals of the first resistive device 300 are respectively connected to a voltage source $V_{DD}$ and the first terminal of the second resistive device 303. The second terminal of the second resistive device 303 is connected to the first terminal of the third resistive device 306. The second terminal of the third resistive device 306 is connected to the drain of the NMOS(Negative-channel Metal-Oxide Semiconductor) 3120 in the first bit line clamp circuit. The source of the NMOS 3120 in the first bit line clamp circuit is connected to the drain of the reference memory cell 318. The source of the reference memory cell 318 is grounded and the gate thereof works as an input for a gate voltage Vgate. Aforementioned resistive devices can be replaced by other devices such as MOS's(Metal-Oxide Semiconductor). Moreover, the resistance of the three devices 300, 303, and 306 could be either identical or different. Those resistance values are identical and represented by R Ohm in this embodiment. Various known clamp circuits can be applied to the first bit line clamp circuit 312 which is composed of a first NMOS 3120 and a first inverter 3123, wherein the input and output of the first inverter 3123 are respectively connected to the drain and gate of the first NMOS 3120.

In reference voltage generator described above, the first reference voltage REF1 is generated in the second terminal of the first resistive device 300, the second reference voltage REF2 is generated in the second terminal of the second resistive device 303, and the third reference voltage REF3 is generated in the second terminal of the third resistive device 306. By elementary circuitry theory, the three reference voltages can be calculated by following formula:

$$REF1 = V_{DD} - I_{ref}*R,$$

$$REF2 = V_{DD} - I_{ref}*2R,$$

$$REF3 = V_{DD} - I_{ref}*3R,$$

where $I_{ref}$ represents the reference current flowing through the reference voltage generator. From above description, it becomes clear that there will be a constant voltage difference $I_{ref}*R$ between any two adjacent reference voltages (e.g., between REF1 and REF2, or between REF2 and REF3), which is due to the effect of the voltage division of the three serially connected resistive devices (300, 303, and 306) which have identical resistance values.

The purpose of the first bit line clamp circuit 312 is to keep the voltage output of the reference voltage generator stable, so that the reference voltage variation due to environmental factors can be minimized. On the other hand, the reference memory cell 318 is intended to control the magnitude of reference current $I_{ref}$ in the reference voltage generator, and thus ensures that the output reference voltage level is correct.

The data saving circuit includes a fourth resistive device 309, a second bit line clamp circuit 315, and a data memory cell 321. The first and second terminals of the fourth resistive device are respectively connected to a voltage source and the drain of the second NMOS 3150 in the second bit line clamp circuit 315. The source of the second NMOS 3150 in the second bit line clamp circuit 315 is connected to both the drain of the data memory cell 321 and the input of a second inverter 3153. The gate of the second NMOS 3150 is connected to the output of the second inverter 3153. The source of the data memory cell 321 is grounded and the gate thereof works as an input for a gate voltage Vgate. The resistance value of the fourth resistive device equals the sum of those of the first through the third resistive devices (300, 303, and 306), i.e., 3R Ohms. The voltage at the second terminal of the fourth resistive device 309 is Vh1 which representing the information stored in the data memory cell 321. Similarly, the purpose of the second bit line clamp circuit 315 is to keep the voltage output of the data saving circuit stable, so that the voltage variation due to environmental factors is minimized. On the other hand, the data memory cell 321 is intended to control the magnitude of reference current $I_{cell}$ in the data saving circuit, and thus various information can be stored therein.

The comparing circuit includes a first comparator 324, a second comparator 327, and a third comparator 330. The first comparator 324 receives the data voltage Vh1 and the first reference voltage REF1 through its negative input terminal and its positive input terminal respectively. A signal X1 is output according to the comparing result. If the first reference voltage REF1 is greater than the data voltage Vh1, then X1 will be a logic "1", otherwise X1 will be a logic "0". The second comparator 327 receives the data voltage Vh1 and the second reference voltage REF2 through its negative input terminal and its positive input terminal respectively. A signal X2 is output according to the comparing result. If the second reference voltage REF2 is greater than the data voltage Vh1, then X2 will be a logic "1", otherwise X2 will be a logic "0". The third comparator 330 receives the data voltage Vh1 and the third reference voltage REF3 through its negative input terminal and its positive input terminal respectively. A signal X3 is output according to the comparing result. If the third reference voltage REF3 is greater than the data voltage Vh1, then X3 will be a logic "1", otherwise X1 will be a logic "0".

Accordingly, when the data voltage Vh1 is less than the third reference voltage REF3, it is necessary that the data voltage Vh1 is also less than the second reference voltage REF2 and the third reference voltage REF1 (since REF3<REF2<REF1), therefore, the state of "X3X2X1" should be "111" in this situation. When the data voltage Vh1 is greater than the third reference voltage REF3, but is less than the second reference voltage REF2, it is necessary that the data voltage Vh1 is less than the first reference voltage REF1, thus the state of "X3X2X1" should be "011" in this situation. When the data voltage Vh1 is greater than the second reference voltage REF2, but is less than the first reference voltage REF1, the state of "X3X2X1" is "001". When the data voltage Vh1 is greater than the first reference voltage REF1, the state of "X3X2X1" is "000".

Decoder 333 determines its output by decoding the input signals X3X2X1. When X3X2X1 equals, for example, "000", "001", "011", or "111", the corresponding output would be a 2-bit data of "00", "01", "10", or "11" respectively. It is also fine to assign the output of the two-bit data to be "11", "10", "01", and "00" or any other permutation thereof. According to aforementioned example of an improved sensing circuit for multi-level flash memory, the present invention employs a single reference voltage generator instead of conventional multi-unit reference voltage generators such that the reference voltage generator according to the present invention has advantages of saving the global circuit dimension, reducing the reference voltage calibration time, and keeping a stable reference voltage difference.

Although only a preferred embodiment has been illustrated and described, it will be appreciated by those skilled in the art that various modifications may be made without departing from the scope of the present invention, which is intended to be limited solely by the appended claims.

What is claimed is:

1. A sensing circuit for multi-level flash memory, comprising:
    a reference voltage generator providing a plurality of reference voltages by voltage division, wherein said plurality of reference voltages have different levels;
    a data saving circuit outputting a data voltage;
    a comparing circuit comparing said data voltage with said reference voltages to output a plurality of comparing signals; and
    a decoder receiving and decoding said comparing signals to output a data representing information stored therein.

2. The sensing circuit for multi-level flash memory of claim 1, wherein said reference voltage generator comprises:
    a plurality of first resistive devices being connecting to each other in serial mode;
    a first bit line clamp circuit to reduce the voltage level variation of said reference voltage generator; and
    a reference memory cell to control magnitude of a current in the reference voltage generator.

3. The sensing circuit for multi-level flash memory of claim 2, wherein said plurality of first resistive devices comprise resistors or MOS's.

4. The sensing circuit for multi-level flash memory of claim 2, wherein said plurality of first resistive devices have identical resistance values.

5. The sensing circuit for multi-level flash memory of claim 2, wherein said first bit line clamp circuit comprises an NMOS transistor and an inverter.

6. The sensing circuit for multi-level flash memory of claim 2, wherein said data saving circuit comprises:
    a second resistive device with a resistance value equal to the sum of the resistance values of said plurality of first resistive devices in said reference voltage generator;
    a second bit line clamp circuit to reduce the voltage level variation in the data saving circuit; and
    a data memory cell to control magnitude of a current in the data saving circuit.

7. The sensing circuit for multi-level flash memory of claim 6, wherein said second resistive device comprises a resistor or a MOS.

8. The sensing circuit for multi-level flash memory of claim 6, wherein
    said second bit line clamp circuit comprises an NMOS transistor and an inverter.

9. A sensing circuit for multi-level flash memory, comprising:
    a reference voltage generator providing a plurality of reference voltages by voltage division, wherein said a plurality of reference voltages have different levels and said reference voltage generator comprises:
        a plurality of first resistive devices being connecting to each other in serial mode;
        a first bit line clamp circuit to reduce the voltage level variation of said reference voltage generator; and
        a reference memory cell to control the magnitude of current in the reference voltage generator;
    a data saving circuit outputting a data voltage, which comprises:
        a second resistive device with a resistance value equal to the sum of the resistance values of said a plurality of first resistive devices in said reference voltage generator;
        a second bit line clamp circuit to reduce the voltage level variation in the data saving circuit;
        a data memory cell to control the magnitude of current in the data saving circuit;
    a comparing circuit comparing said data voltage with said reference voltages to output a plurality of comparing signals; and
    a decoder receiving and decoding said comparing signals to output a data representing information stored therein.

10. The sensing circuit for multi-level flash memory of claim 9, wherein said plurality of first resistive devices in said reference voltage generator comprise resistors or MOS's.

11. The sensing circuit for multi-level flash memory of claim 9, wherein said second resistive device in said data saving circuit comprises a resistor or a MOS.

12. The sensing circuit for multi-level flash memory of claim 9, wherein said plurality of first resistive devices in said reference voltage generator have identical resistance values.

13. The sensing circuit for multi-level flash memory of claim 9, wherein said first bit line clamp circuit comprises an NMOS transistor and an inverter.

14. The sensing circuit for multi-level flash memory of claim 9, wherein said second bit line clamp circuit comprises an NMOS transistor and an inverter.

* * * * *